United States Patent

Korst et al.

[11] Patent Number: 5,848,437
[45] Date of Patent: Dec. 8, 1998

[54] METHOD OF AND SYSTEM FOR INTERLEAVING REAL-TIME FILES WITH DIFFERENT PERIODS

[75] Inventors: Johannes H. M. Korst; Serverius P. P. Pronk, both of Eindhoven, Netherlands

[73] Assignee: U.S. Philips Corporation, New York, N.Y.

[21] Appl. No.: 672,019

[22] Filed: Jun. 24, 1996

[30] Foreign Application Priority Data

Jun. 29, 1995 [EP] European Pat. Off. .............. 95201768

[51] Int. Cl.[6] .................................................. G06F 12/02
[52] U.S. Cl. ........................... 711/157; 711/170; 707/101
[58] Field of Search .................. 395/421.07, 497.01, 395/484, 611, 615; 711/127, 157, 110, 170; 707/100, 101, 102

[56] References Cited

U.S. PATENT DOCUMENTS 3,675,211  7/1972  Raviv ........................................ 341/67
4,071,887  1/1978  Daly et al. ............................... 395/309
5,276,827  1/1994  Delaruelle et al. ...................... 711/217
5,568,278  10/1996 Nakano et al. .......................... 358/427

OTHER PUBLICATIONS

Yu et al., "Efficient Placement of Audio Data on Optical Disks for Real–time Applications", Communications of the ACM, Jul. 1989, vol. 32, No. 7, pp. 862–871.

*Primary Examiner*—Tod R. Swann
*Assistant Examiner*—J. Peikari
*Attorney, Agent, or Firm*—Michael E. Belk

[57] ABSTRACT

A method and a system for the interleaving of real-time files so as to form an interleaved combination for storage or transmission. They can be used for a multimedia application in which real-time files containing audio and/or video information are combined so as to form a real-time file for use by the application. The invention utilizes a structure in which the real-time files are stored in dependence on their period in conformity with a given space-saving criterion. Subsequently, on the basis of the structure, an interleaved combination is formed in which the number of empty positions in the combination is limited.

18 Claims, 6 Drawing Sheets

METHOD OF AND SYSTEM FOR INTERLEAVING REAL-TIME FILES WITH DIFFERENT PERIODS

BACKGROUND OF THE INVENTION

The invention relates to a method of interleaving real-time files, each of which comprises a series of uniform blocks, in order to form an interleaved combination for block-by-block linear presentation to a medium, each real-time file having an own period, which method involves a set of mutually different periods.

The invention also relates to a system for interleaving real-time files, each of which comprises a series of uniform blocks, in order to form an interleaved combination for block-by-block linear presentation to a medium, each real-time file having an own period, and a set of mutually different periods being involved in said system.

The invention also relates to a file with an interleaved combination formed by means of the above method.

The invention also relates to a carrier with an interleaved combination formed by means of the above method.

A method of this kind is known from the article "Efficient Placement of Audio Data on Optical Disks for Real-Time Applications", Yu C. et al, Communications of the ACM, Vol. 32, No. 7, July 1989. The cited article describes the combination of two audio records so as to form a composite record. One application thereof is the combination of real-time audio files so as to form an interleaved combination for storage on an optical disc. A real-time file contains data which is to be fetched from the disc with a fixed, predetermined transfer rate. To this end, a real-time file is stored on the disc in a distributed fashion as follows. The file consists of an integer number of equally large data blocks and between two successive data blocks there exists a gap which consists of a number of empty blocks. The size of this gap is equally large for every two successive data blocks of a file. When a real-time file thus composed is read, the desired transfer rate of data from the disc is obtained by alternation of data blocks and empty blocks. Upon combination of two real-time files according to the known method, the data blocks of one file are arranged in positions corresponding to empty blocks of the other file, thus resulting in a short interleaved combination. The cited article describes how two real-time files can be combined and also illustrates a number of special combination examples.

SUMMARY OF THE INVENTION

It is inter alia an object of the invention to provide a method and a system of the kind set forth for the formation of a short interleaved combination, the method and the system being suitable for larger numbers of real-time files than the known method. To achieve this the method in accordance with the invention is characterized in that it comprises the following steps:

forming a tree structure having a root and nodes, in which:
  each period of the set corresponds to a number of the nodes, the nodes being arranged according to increasing period as from the root,
  a number of the nodes are children of a number of parent nodes,
  the children of a parent node have a mutually equal period which is a multiple of the period of the parent node, the number of children of the parent node being equal to the quotient of the period of the children and the period of the parent node;

an assignment step in which the series of blocks of a given real-time file are consecutively assigned to a list of one of the nodes which has a period equal to that of the given real-time file, and forming the interleaved combination for at least one of the nodes by cyclically addressing the lists of the children of the latter node thus composed, and by addressing consecutively within the lists.

An interleaved combination of short length is formed by assignment of the series of blocks of real-time files to lists of nodes in the tree structure and by subsequently forming the interleaved combination by cyclically addressing said lists of the nodes.

A version of the method in accordance with the invention is characterized in that the assignment step comprises:

i) execution of the following sub-steps for each candidate node whose period corresponds to the given real-time file:
  determining all paths through the tree structure from the root, through the relevant candidate node, and down to the lowest level,
  calculating for each of the paths a length which is equal to a sum over all nodes of the path, of the respective products of the number of blocks of the real-time files in the list and the period of the relevant node, and
  determining therefrom the instantaneously longest path through the relevant candidate node; and
ii) selecting the shortest path from the instantaneously longest paths thus determined and assigning the series of blocks of the given real-time file to the node wherethrough said shortest path extends and whose period corresponds to that of the given real-time file.

The longest path from the root to the outermost children indicates how long the interleaved combination would be if it were based on the actually filled tree. As a result, for all relevant nodes it is checked how long the instantaneously longest path through each of said nodes is, and for the assignment of the next real-time file the node is selected whose instantaneously longest path is the shortest. As a result, the length increase of the interleaved combination, if made after assignment of said real-time file, will be the least.

A version of the method in accordance with the invention is characterized in that the assignment step is repeated for each of the real-time files in an order of non-decreasing period of the real-time files. By assigning the real-time files in the order of non-decreasing period, the tree structure is filled as from the root in the direction of the increasingly remoter nodes. This reduces the risk of appearance of empty positions in the tree structure and the interleaved combination to be formed, so that a shorter interleaved combination is obtained.

A version of the method in accordance with the invention is characterized in that the interleaved combination is formed by transferring, starting with the children having the highest period and finishing at the root, elements from the lists of children of a given parent node to the list of the relevant parent node, comprising, in a cyclic order of the children and for as long as the list of all of these children is not yet empty, the repetition of the following sub-steps:

the transfer of the first element of the list of the relevant child to the list of the parent node or, if the list of the relevant child is empty:
the addition of an empty element to the list of the parent node.

The interleaved combination is thus simply formed as a list of the root from a tree structure comprising groups of nodes with lists, said groups having mutually different periods.

A version of the method in accordance with the invention is characterized in that the method comprises the following steps:

formation of a first matrix which comprises a number of rows which is equal to the first period;

assignment to the first matrix of a real-time file having the first period by means of the sub-steps:

determination of an instantaneously least-filled row of the first matrix, assignment of the series of blocks of the real-time file to the instantaneously least-filled row;

formation of a second matrix which comprises a number of rows which is equal to the second period;

assignment to the second matrix of the blocks already assigned to the first matrix by assignment of successive columns of the first matrix to columns of the second matrix;

concatenation of successive columns of the second matrix so as to form the interleaved combination.

The arrangement of the blocks of the real-time files in the rows of the matrix, each time the instantaneously shortest row being chosen, results in a short interleaved combination on the basis of concatenation of the columns of the matrix.

The system in accordance with the invention is characterized in that it comprises:

means for forming a tree structure having a root and nodes, in which:

each period of the set corresponds to a number of nodes, the nodes being arranged according to increasing period as from the root, a number of the nodes are children of a number of parent nodes, the children of a parent node have a mutually equal period which is a multiple of the period of the parent node, the number of children of the parent node being equal to the quotient of the period of the children and the period of the parent node;

assignment means for assigning the series of blocks of a given real-time file consecutively to a list of one of the nodes which has a period equal to that of the given real-time file; and interleaving means for forming the interleaved combination for at least one of the nodes by cyclically addressing the lists thus composed of the children of the latter node and by addressing consecutively within the lists.

This system is suitable for forming a short interleaved combination from a number of real-time files in which mutually different periods may occur.

Various attractive versions of the method and embodiments of the system in accordance with the invention are disclosed in dependent Claims.

BRIEF DESCRIPTION OF THE DRAWINGS

These and other aspects of the invention will be apparent from and elucidated with reference to the embodiments described hereinafter in conjunction with the drawings, in which.

DESCRIPTION OF THE REFERRED EMBODIMENTS

Figure 1:
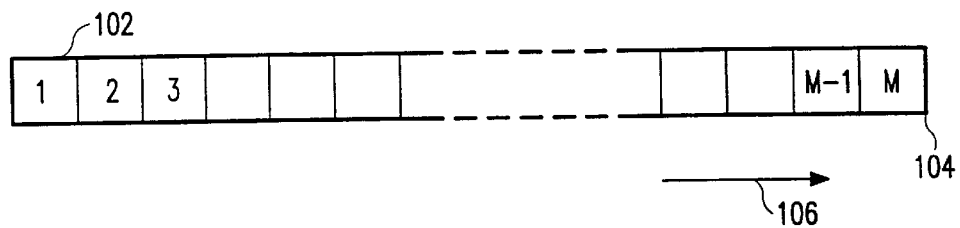
FIG. 1 is an abstract representation of a compact disc with sectors on a spiral.

One application of the invention concerns the arrangement of real-time files on a compact disc. FIG. 1 shows an abstract representation of a compact disc with a set of sectors 102 which are consecutively arranged on one spiral 104. A compact disc player reads the compact disc at a fixed rate of 75 sectors per second in a read direction 106 relative to the spiral. The compact disc comprises files with data, a file covering a number of sectors. For non-real-time applications the sectors of a file are usually consecutively arranged on the spiral. For a number of real-time applications the sectors of a file are scattered on the spiral in such a manner that when the compact disc is read at said rate of 75 sectors per second, the sectors of the file become available at a speed at which they must be processed real-time. The buffering of data from said sectors thus requires a minimum amount of storage space. Files whose sectors are scattered in the above manner are referred to as real-time files. The international standard ISO 9660 describes a specific structure for the storage of real-time files on a compact disc. Such a real-time file comprises a number of blocks, each of which contains the same number of consecutive sectors. Between two successive blocks of the real-time file there exists a gap which is the same for every pair of successive blocks. A file contains a given amount of data, the last block being only partly filled with data in dependence on said amount and on the subdivision into blocks. Furthermore, it may be that a file containing a comparatively small amount of data comprises only 1 block.

Figure 2:
FIG. 2 shows a real-time file with blocks and gaps.

FIG. 2 shows a real-time file with blocks 202 of 3 sectors and gaps 204 between the blocks of 4 sectors. The sectors in the gap may remain unused or be used by other files, so that the files together require less space on the compact disc. If non-real-time files use the sectors of such gaps, the reading time for these files will be longer because now they are unnecessarily scattered. However, if other real-time files utilize the empty sectors of the gaps the read time will not be prolonged because these files themselves also have to be stored in a scattered fashion. The interleaving of the blocks of one file in gaps of another file is called the interleaving of the two files. Real-time files are usually processed in a linear fashion, i.e. in the order of the blocks are in the file.

Figure 3:
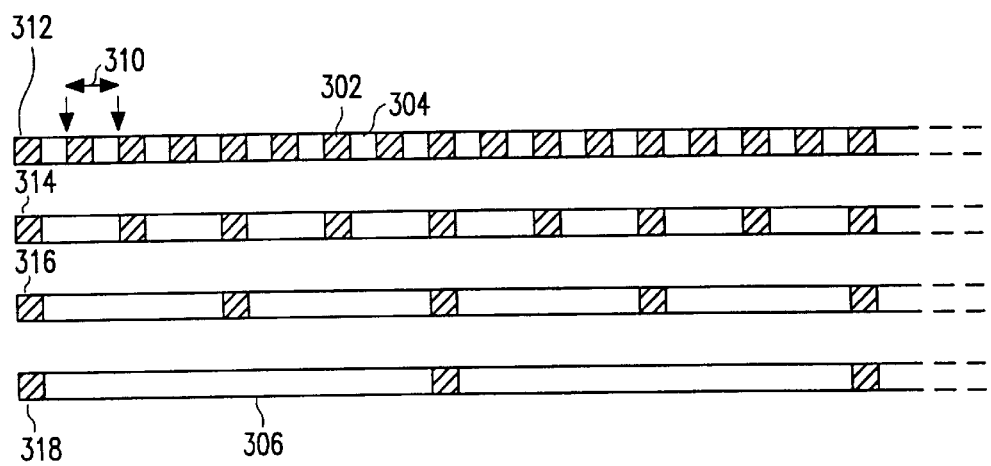
FIG. 3 shows a number of different types of real-time files.

FIG. 3 shows a number of different types of real-time files. The data blocks of these files are equally large, like the block 302, whereas the size of their gaps differs, for example the gap 304 versus the gap 306. The gap for each file in FIG. 3 equals a multiple of the block size. For a given application the blocks may comprise a single sector, in which case the files have a so-called block size amounting to 1, but in another application the blocks may comprise several sectors. The distance between the beginning of two successive data blocks, measured in blocks, is referred to as the period of the file; for example, the distance 310 for the file 312. The files 312 to 318 have a period of 2, 4, 8 and 16, respectively. An example of the files shown in FIG. 3 are the ADPCM (adaptive differential pulse code modulation) files as defined for CD-i (Compact Disc interactive). These files have a block size amounting to 1 and may contain audio data of a quality level which is dependent on the period.

Figure 4:
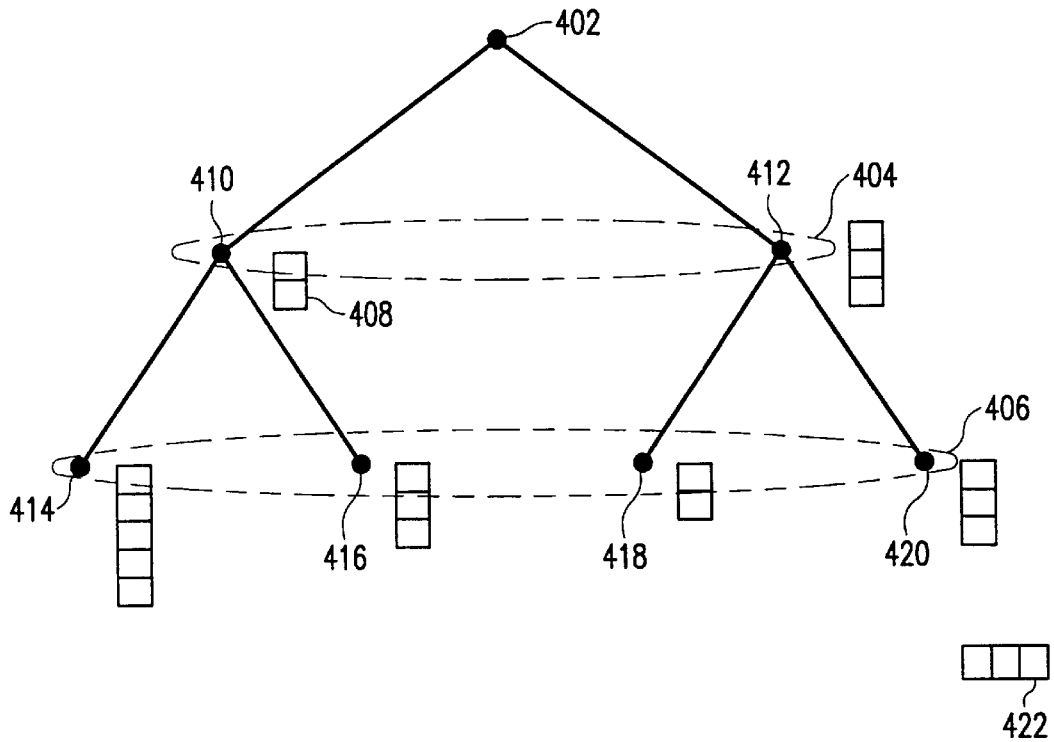
FIG. 4 shows an application of the invention for real-time files having a period of 2 and of 4.

FIG. 4 illustrates an application of the invention for real-time files having a period of 2 and a period of 4. The method in accordance with the invention utilizes a tree structure for the interleaving of the real-time files. The tree structure has a root 402 and nodes for each period occurring in the set of files to be interleaved. The nodes are in this case grouped in levels which are arranged, viewed from the root, according to increasing period and comprise a number of nodes which equals the period whereto the level corresponds. In the present example the tree structure has a level 404 with nodes 410 and 412 which correspond to a period of 2, and a level 406 with nodes 414–420 which correspond to a period of 4. A node at the level 404 is connected to two nodes at the level 406. These two nodes are referred to as the children of the node 404. Node 410 is referred to as a parent node of the children 414 and 416. In FIG. 4 the nodes 414 and 416 are children of the node 410. Each node in the tree structure has a list, for example the list 408 of the node 410, for blocks of the real-time files assigned to the node. Such a list is empty for as long as no blocks have been assigned yet. The method in accordance with the invention comprises a first step in which the blocks of the real-time files are assigned to the lists and a second step in which the lists built up are used so as to obtain an interleaved combination in which the real-time files are included in a manner such that they have the desired period. During the first phase the blocks of a real-time file are consecutively assigned to a list of a node which corresponds to the period of the real-time file. A real-time file 422, comprising 3 blocks and having a desired period of 2, should be assigned to the node 410 or to the node 412. In order to determine which assignment is most suitable, for both cases it is checked how long the interleaved combination would become for the present filling of the tree structure. The length of the interleaved combination is determined by the length of the longest path through the tree structure. Therefore, for both nodes there is determined the length of the longest path which starts at the root and extends through the relevant node and the blocks of the real-time file 422 are assigned to the node having the shorter longest path. For the determination of the length of a path the fact is taken into account that the blocks in the list are arranged so as to be consecutive, whereas in the interleaved combination these blocks are spaced apart in conformity with the associated period. Therefore, the length of the files for a node is calculated by multiplying the number of blocks in the list by the period of the node. Subsequently, these lengths are summed over the nodes so as to form the length of the path through the nodes. A first path through the node 410 is formed by the root and by the nodes 410 and 414. The length of this path amounts to 0+2×2+5×4=24. The second path through the node 410 has a length equal to 0+2×2+3×4=16. The longest path through the node 410 thus has a length of 24. The first path through the node 412 is formed by the root and by the nodes 412 and 418 and has a length of 0+3×2+2×4=14. The second path through the node 412 has a length of 0+3×2+3×4=18. The longest path through the node 412 thus has a length of 18. This can be summarized as follows: the longest path through the node 410 has a length of 24 and the longest path through the node 412 has a length of 18. Therefore, the blocks of the real-time file 422 are assigned to the list of the node 412.

The interleaved combination of the real-time files can be stored on, for example a magnetic or optical disc or a magnetic tape. However, it may also be transmitted via a network for processing or storage in a different location. The invention is not restricted by the use made of the interleaved combination so that it can also be utilized in applications other than those mentioned.

Figure 5:
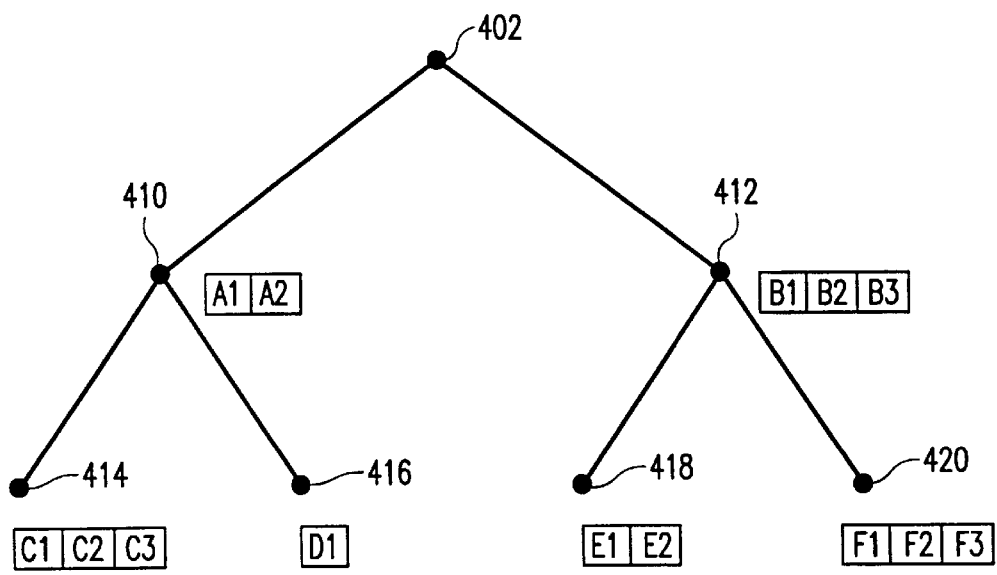
FIG. 5 shows a filled tree structure prior to the formation of the interleaved combination.

FIG. 5 shows a filled tree structure prior to the formation of the interleaved combination. The elements of the nodes 414–420 at the lowest level are added to the lists of nodes 410–412 at the first level. For a given node at the first level each time the first element of a list of a child of the given node is transferred to the list of the given node in a cyclic order. A simple method of transfer is to add the first element to the bottom of the list of the given node and to remove it subsequently from the list of the child. If the list of a child is empty, an empty element is transferred to the higher list so as to maintain the desired period of the real-time files. Element C1 of the list of the node 414 is added to the list of the node 410 and subsequently element D1. After that, a return is made to the list of the node 414 in which the element C2 now is the first element which is added to the list of the node 410. Subsequently, an empty element is added to the list of the node 410, because the list of the node 416 is empty. This cyclic addressing of the lists of the children is continued until all lists of the children are empty. Subsequently, the elements of the children of the node 412 are transferred to the list of this node. The sequence is: first the element E1, and subsequently F1, E2 and F2, after which an empty element is required, and finally F3 is transferred.

Figure 6:
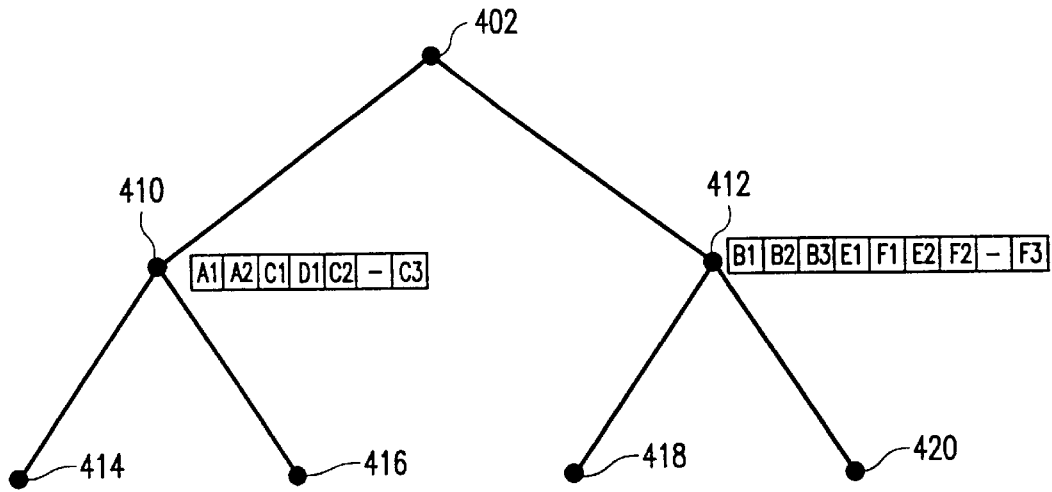
FIG. 6 shows an intermediate step in the formation of the interleaved combination.

FIG. 6 shows an intermediate step in the formation of the interleaved combination. The lists of the nodes at the lowest level are empty and a similar procedure is then followed for the lists at the first level. Element A1 of the list of the node 410 is assigned to the list of the root 402 and subsequently element B1 of the list of the node 412. After that the operation resumes with the list of the node 410, in which the element A2 is now the first element, and again the list of the node 412. This procedure is repeated until the lists at the first level are empty; at the instant at which one of the lists of the node 410 or the node 412 is empty, empty positions are then added to the list for the root as an alternative for an element of the relevant empty list.

Figure 7:
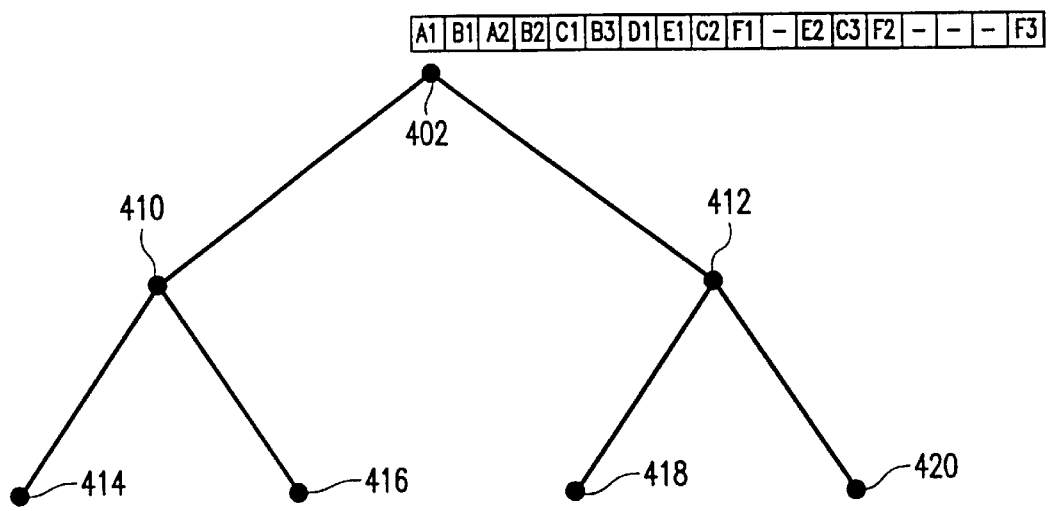
FIG. 7 shows the tree structure in a state in which the elements of the lower lists have been transferred to the list of the root.

FIG. 7 shows the tree structure in a state in which the elements of the lower lists have been transferred to the list of the root. The list of the root then contains the interleaved combination of the real-time files arranged in the tree structure. As a result of the level-wise combination, the real-time files have obtained the desired period and, where necessary, empty elements have been added. The actual order in which the children are addressed within a cycle for a given node can be chosen in such a manner that the number of empty blocks in the interleaved combination is minimized. The length of the interleaved combination is thus also minimized. In that case it is necessary to commence with the node in which the longest path in the tree structure terminates. In the example of FIG. 4 this is the path terminating in the node 420. As appears from FIG. 5, at the first level the start should be made at the node 412. This node has the longest list so that, if the list of the node 410 is empty, an empty element will be added to the list of the root. As a result of this choice in respect of starting, the elements F1, F2 and F3 are shifted to the left in the list of the root, so that three of the four empty elements in said list are no longer necessary. The list at the root then contains the following series of elements: B1, A1, B2, A2, B3, C1, F1, D1, E1, C2, F2, -, E2, C3, F3.

Alternatively, during the filling of the tree structure with the real-time files the mutual positions of the elements of the list of nodes to be assumed in the list for the root can be taken into account. Because the nodes at the lowest level in FIG. 4 are addressed in the order from the node 414 to the node 420, the elements of the lists of these nodes also appear in the ultimate list of the root in this order; this has consequences for the length of the interleaved combination. The element C1 precedes the element D1, which itself precedes the element E1 which in its turn precedes the element F1. When the order of addressing of the nodes has been chosen, the consequences thereof for the length of the interleaved combination can be taken into account. To this end, upon determination of the length of a path its length is incremented by a given value; for a node in the path the calculated length of the files in the list is increased by an offset which corresponds to the position in the interleaved combination. To this end, each part of the path is increased by a value equal to a multiple of the period p of the node where the part commences: the first part underneath the node by the value 0, the second part by the value p, the third part by the value 2×p, etc. for the whole number of parts underneath the node. For example, for the path through the nodes 412 and 420 in FIG. 5 this means 3×2+0+3×4+2 for the chosen node addressing order.

Figure 8:
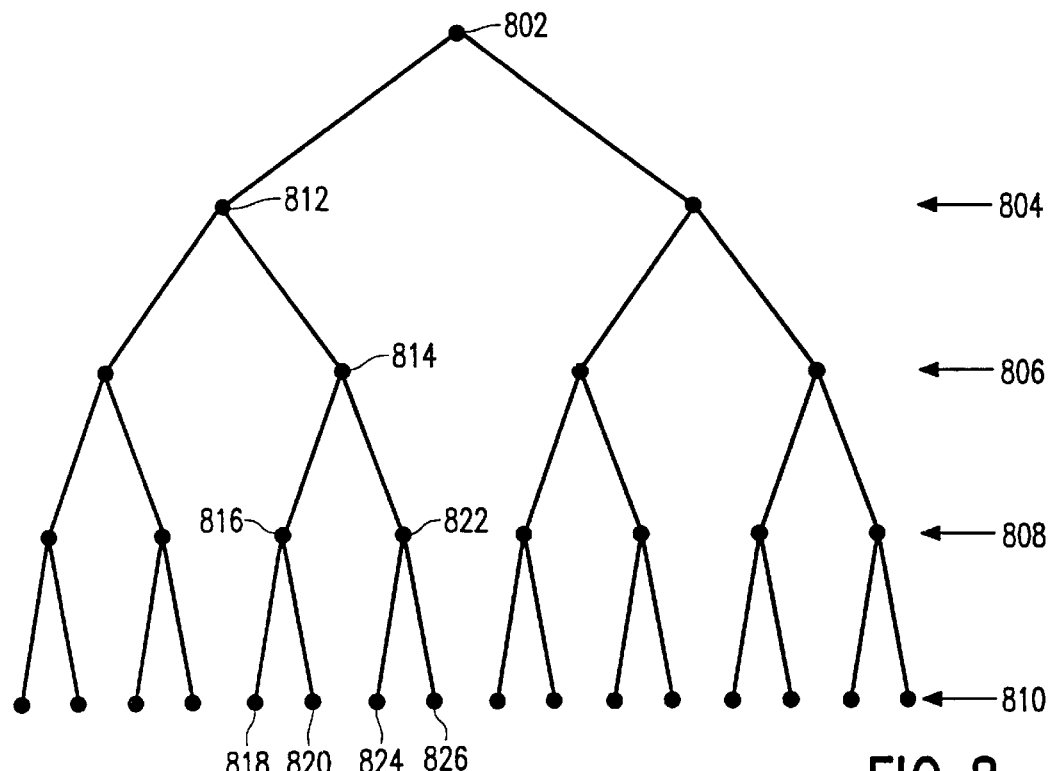
FIG. 8 shows a tree structure suitable for real-time files having a period of 2, 4, 8 and 16.

FIG. 8 shows a tree structure which is suitable for real-time files having periods of 2, 4, 8 and 16. The tree structure comprises a root 802, a level 804 with two nodes for a period of 2, a level 806 with 4 nodes for period of 4, a level 808 with 8 nodes for period of 8, and a lowest level 810 with 16 nodes for period of 16. If in this case a real-time file having, for example a period of 4 is assigned, each of the nodes having a period of 4 (in this case situated at the level 806), will be checked for the longest path there through. There are 4 paths through each of these nodes. The following paths extend through the node 814: a path with 812, 814, 816 and 818; a path with 812, 814, 816 and 820; a path with 812, 814, 822 and 824; and a path with 812, 814, 822 and 826. One of these paths is the longest path through the node 814. For the other three nodes having a period of 4, situated at the level 806, the longest path there through is also determined. From the 4 longest paths thus determined the shortest path is selected and the blocks of the real-time file are assigned to the list of the node wherethrough this shortest longest path extends. If the real-time files to be interleaved have a different period, evidently, a different tree structure will be required. In the case of periods of 2, 8 and 16, a tree structure as shown in FIG. 8 can be used, be it that its level 806 then remains empty. However, a more specific tree structure can also be defined in which the level 806 is completely absent. In such a tree structure the nodes of the level 804 are then connected to 4 nodes of the level 808. The invention can be used for other sets of real-time files having other periods, a tree structure then being defined which has a level which comprises nodes for any period occurring, its number of nodes being equal to said period. For the tree structures described thus far it holds that the different periods occurring in the set of real-time files to be interleaved can be divided by one another. However, the invention is not restricted to such a special set and an example of a more general set will be described hereinafter.

Figure 9:
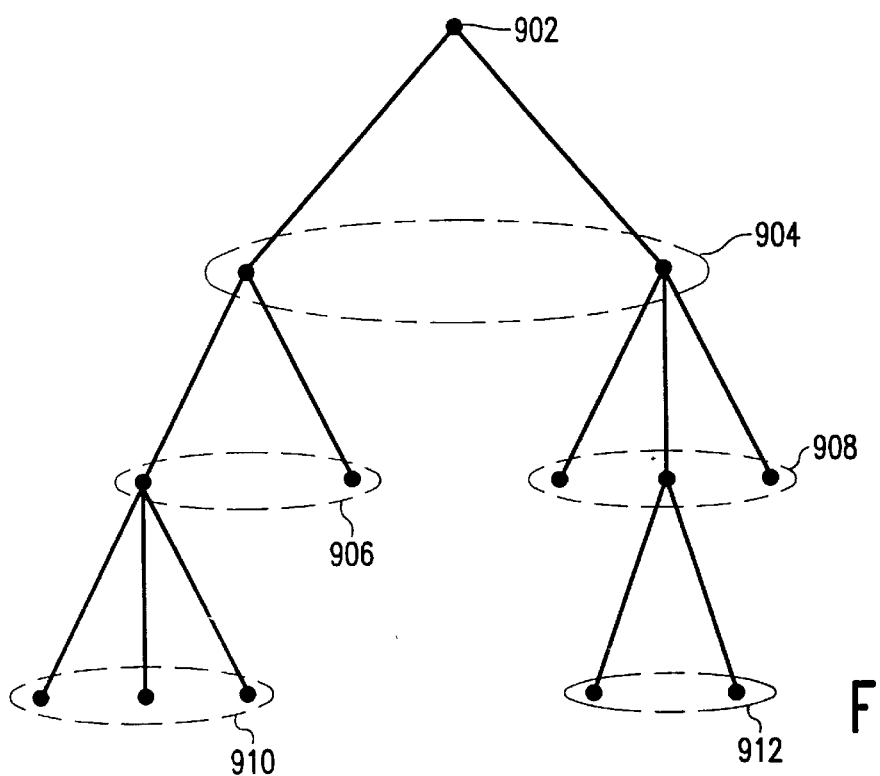
FIG. 9 shows a tree structure suitable for real-time files having a period of 2, 4, 6 and 12.

FIG. 9 shows a tree structure which is suitable for real-time files having periods of 2, 4, 6 and 12. This tree structure comprises a root 902 and a group 904 with nodes for a period of 2. The tree structure also comprises a group 906 with nodes for a period of 4, a group 908 with nodes for a period of 6, and two groups 910 and 912 for a period of 12. This tree structure is less regular than that shown in the FIGS. 4 to 8, but the invention is also suitable for such a less regular, more general tree structure. Characteristics of the invention and the associated tree structure are:

- any period occurring for the real-time files to be interleaved has been assigned to one or more nodes in the tree structure,
- a node has an associated period, a period of 1 having been assigned to the root,
- the children of a given node have a mutually equal period which is equal to a multiple of the period of the given node,
- the number of children of a given node equals the quotient of the period of the children and the period of the given node.

For the assignment of a real-time file having a given period in a tree structure as shown in FIG. 9 it is also checked through which node of the group of nodes having said given period the shortest longest path extends, the series of blocks of said real-time file being assigned to the relevant node. Furthermore, the interleaved combination is formed, in the same way as described with reference to the FIGS. 5 and 7, by transferring the elements of children having the highest period to the node above said children.

During the first phase of the method in accordance with the invention the real-time files may be arranged in advance in an order of non-decreasing period and the files can be assigned to the nodes of the tree structure in said order. The tree structure is then filled from the top downwards and the risk of appearance of empty blocks in the interleaved combination at a later stage is reduced. The length of the interleaved combination is thus reduced, so that, for example less space is required for storage on a disc. In the first phase of the method in accordance with the invention the real-time files can be arranged in an order of non-increasing length. The length of the real-time file then equals the number of blocks of the real-time file multiplied by the period of the real-time file. As a result of this arrangement, first the longest files are assigned to the tree structure and smaller files, being assigned later, could fill any gaps caused by the longer files. The risk of appearance of empty blocks in the interleaved assembly is thus reduced. The length of the interleaved combination is thus also reduced. Arrangement according to period as well as according to length is possible; for example, first arrangement according to period in a non-decreasing order and, within a number of files having a mutually equal period, arrangement in an order of non-increasing length.

Figure 10:
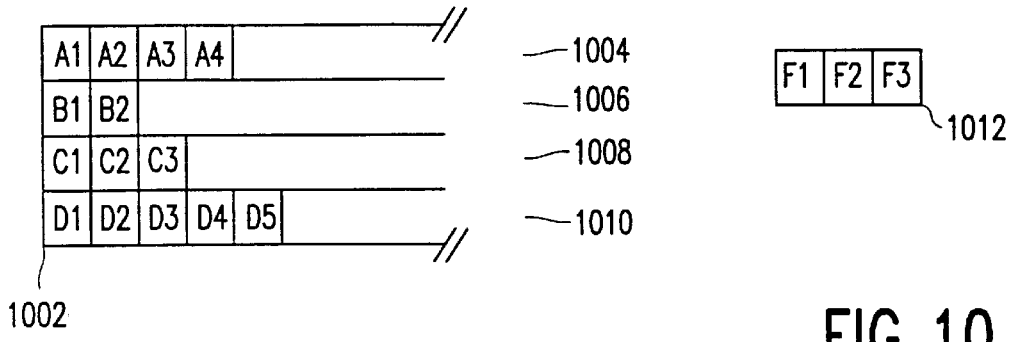
FIG. 10 shows a matrix suitable for interleaving real-time files having a period of 4.

FIG. 10 shows a matrix which is suitable for the interleaving of real-time files having a period of 4. Matrix 1002 comprises a number of rows which is equal to the period of the file to be processed; in this example there are 4 rows, i.e. 1004, 1006, 1008 and 1010. The method of the invention comprises a first phase in which the series of blocks of the real-time files are assigned to the rows of the matrix, and a second phase in which the interleaved combination is formed by concatenation of the successive columns of the matrix. In order to achieve an as short as possible interleaved combination, the series of blocks of a given real-time file are assigned to the least-filled row of the matrix at the relevant instant. When the matrix has been filled as shown in FIG. 10, the blocks of a next real-time file 1012 will be assigned to the row 1006 because this row is the shortest row at that instant. In order to avoid unnecessary use of space, the matrix will usually not contain a copy of the blocks of the real-time files, but only references to said blocks. The matrix is large enough for the total number of blocks of the real-time file or can be simply dynamically extended by utilizing, for example concatenated lists as rows of the matrix.

Figure 11:
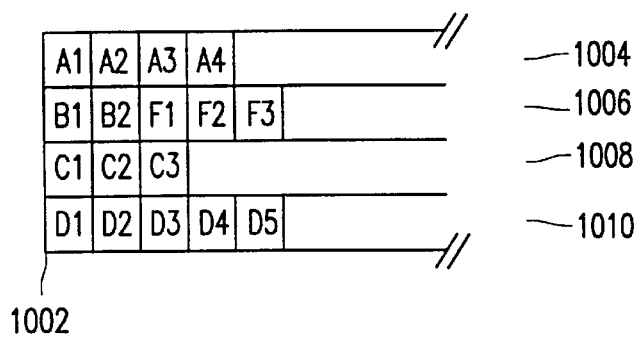
FIG. 11 shows the matrix in a state in which the last real-time file has been assigned.
Figure 11:
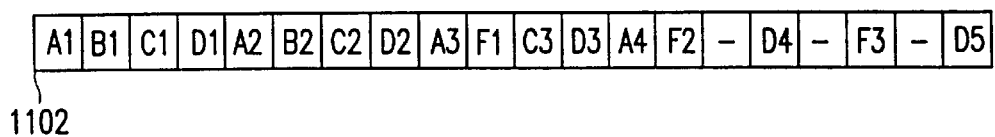
Figure 11:
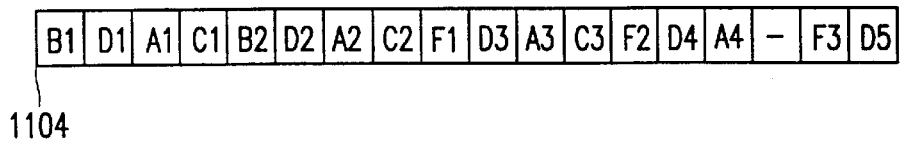

FIG. 11 shows the matrix in a state in which the last real-time file has been assigned. The interleaved combination is then formed by concatenation of the columns of the matrix, starting at the left-hand column and finishing at a completely empty column. The interleaved combination 1102 ultimately contains the blocks of the real-time files with possibly empty blocks in the positions in which a row was not filled to the highest position in the combination. The number of empty blocks required can be reduced by arranging the rows of the matrix in an order of non-increasing length prior to the formation of the interleaved combination, so that the length of the interleaved combination is reduced. In the example of FIG. 11 the order of the rows is 1006, 1010, 1004 and 1008 from the top downwards after such an arrangement. The resultant interleaved combination 1104 comprises fewer empty blocks so that it is shorter than the previously mentioned combination 1102.

Figure 12:
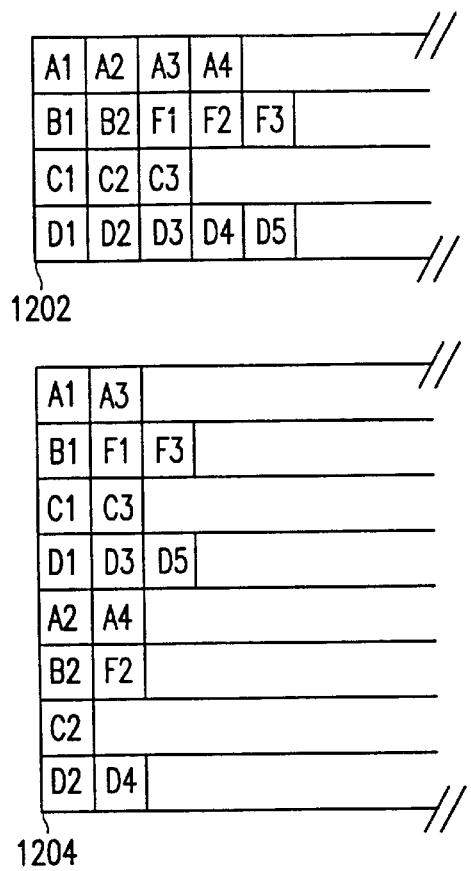
FIG. 12 shows two matrices for the interleaving of real-time files having a period of 4 and of 8.

FIG. 12 shows two matrices which are suitable for the interleaving of real-time files with a period of 4 and of 8. In such a situation, involving two different periods, one matrix has a number of rows which is equal to the one period whereas the other matrix has a number of rows which is equal to the other period. The series of blocks of a given real-time file is assigned to a row of the matrix whose number of rows equals the period of the real-time file. The interleaved combination is formed on the basis of the columns of the matrix which corresponds to the highest period. The blocks which were assigned to rows of the matrix having a lower period are copied, in a given manner to be described hereinafter, to the matrix having the higher period. A method which can be used in this respect is to assign first the real-time files having the smallest period to the corresponding matrix; subsequently, the rows of this matrix are distributed across the matrix corresponding to the higher period, after which the real-time files having said higher period are added, and finally the interleaved combination is formed on the basis of the columns of the latter matrix. FIG. 12 shows a matrix 1202 having 4 rows whereto real-time files having a period of 4 have been assigned. Also shown is a matrix 1204 whereto real-time files having a period of 8 can be assigned. Upon copying of the blocks of the matrix 1202 to the matrix 1204 a row of the matrix 1202 is distributed between two rows of the matrix 1204 which have a spacing of 4. In a general case a row of the first matrix is distributed between a number of rows in the second matrix, the number of rows being equal to the quotient of the period of the second matrix and that of the first matrix, the rows having a spacing equal to the period of the first matrix. The blocks of real-time files having a period of 8 are assigned to rows of the matrix 1204, for each file there being determined the instantaneously shortest row whereto the blocks can be assigned. The interleaved combination is formed by consecutively arranging the columns of the matrix 1204, the real-time files having the period of 4 also being taken up in the combination.

The step of assigning files to the first matrix could be implicitly carried out by directly assigning these files to the matrix corresponding to the higher period, the blocks then being distributed in the described manner. The described method in accordance with the invention, in which matrices are used as a temporary storage structure, is not limited to real-time files having said two periods. For use in conjunction with other periods use is made of matrices whose number of rows corresponds to said other periods. For application with real-time files in which more than two different periods occur, more matrices, each comprising the appropriate number of rows, are then required.

The described method utilizing a tree structure and the described method utilizing matrices have a common aspect. According to both methods the series of blocks is consecutively arranged in a temporary structure in conformity with a given criterion so that the ultimate interleaved combination is short. After this arrangement, according to both methods the structure is read in a cyclic order which is "perpendicular" to the original order of arrangement, each time one block of the originally consecutive series being transferred to the interleaved combination. In addition to the described tree structure and matrix, other, more or less similar structures which have a similar function as a temporary storage structure are also feasible. Examples in this respect are a dependency graph and a group of lists which are treated as a matrix in an explicit or non-explicit manner.

Figure 13:
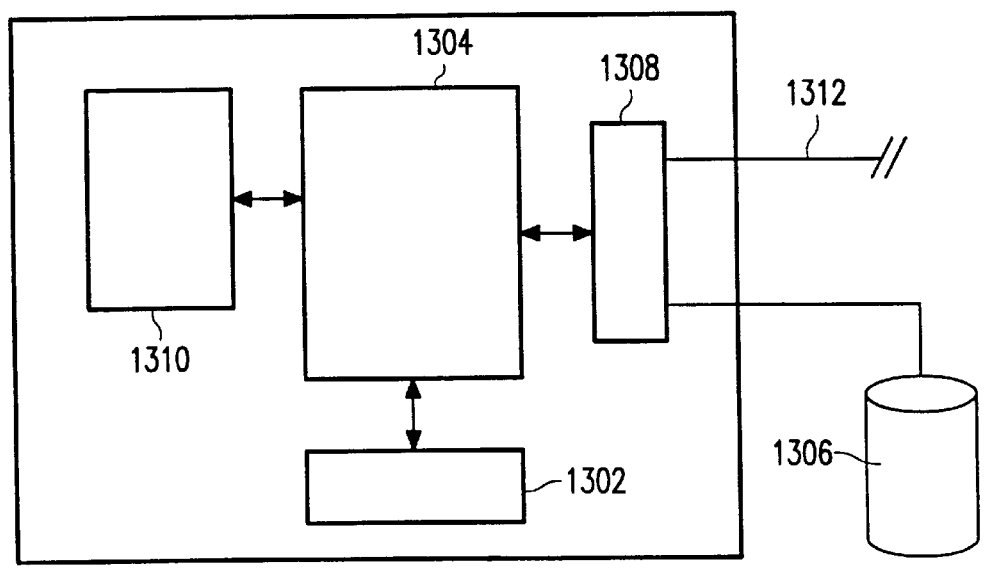
FIG. 13 shows the essential components of a system in accordance with the invention. (parenthetical) Corresponding reference numerals in the drawings denote similar elements. (parenthetical)

FIG. 13 shows the essential components of the system in accordance with the invention. The system is suitable for the interleaving of real-time files so as to form an interleaved combination by means of the described method. The system can be constructed so as to include a general-purpose computer which comprises a program for executing the method in accordance with the invention. The system comprises a processor 1302 for executing the program which is loaded into the memory section 1304 for this purpose. The real-time files are stored on one or more discs 1306 which are addressed by the interface 1308. The interface reads the necessary information from the disc and applies it to the program. The system also comprises a memory section 1310 for the storage of a tree structure for forming the interleaved combination. The program comprises means for forming the tree structure on the basis of the periods of the relevant real-time files and for consecutively assigning blocks of the real-time files to lists of nodes in the tree structure. The program also comprises means for forming the interleaved combination by cyclically addressing the lists composed for at least one level. The program may also comprise means for determining the length of the paths in the tree structure upon assignment of the blocks, for determining per node at a level which is the longest path through said node, and for determining the shortest longest path for all nodes at that level. Furthermore, the program may comprise means for arranging the real-time files according to period and according to length, and means for transferring an element of a list of a level in the tree structure to a list of a higher level. The interface 1308 is also suitable for storing the interleaved combination formed from the filled tree structure on a disc. As a supplement, or as an alternative, the interface 1308 can transmit the interleaved combination via a network connection 1312.

The memory section 1310 in an alternative embodiment of the system in accordance with the invention is suitable for the storage of matrices for forming the interleaved combination. The program is then suitable for forming the matrices on the basis of the relevant real-time files and for assigning blocks of the real-time files to the matrices.

We claim:

1. A method of interleaving a set of real-time files each comprising a series of uniform blocks and having a period, and the set of files includes files having a different period than other files in the set, comprising the following steps of:

forming a tree structure having a root and nodes, in which:
each period of the set corresponds to a number of the nodes, the nodes being arranged according to increasing period as from the root,
a number of the nodes are children of a number of parent nodes,
the children of a parent node have a mutually equal period which is a multiple of the period of the parent node, the number of children of the parent node being equal to the quotient of the period of the children and the period of the parent node;

an assignment step in which the series of blocks of a given real-time file are consecutively assigned to a list of one of the nodes which has a period equal to that of the given real-time file, and forming the interleaved combination for at least one of the nodes by cyclically addressing the lists of the children of the latter node thus composed, and by addressing consecutively within the lists.

2. A file with an interleaved combination, produced by the method claimed in the claim 1.

3. The method as claimed in claim 2, in which the assignment step comprises:

I) execution of the following sub-steps for each candidate node whose period corresponds to the given real-time file:
determining all paths through the tree structure from the root, through the relevant candidate node, and down to the lowest level,
calculating for each of the paths a length which is equal to a sum over all nodes of the path, the respective products of the number of blocks of the real-time files in the list, and the period of the relevant node, and
determining therefrom the instantaneously longest path through the relevant candidate node; and ii) selecting the shortest path from the instantaneously longest paths thus determined and assigning the series of blocks of the given real-time file to the node wherethrough said shortest path extends and whose period corresponds to that of the given real time file.

4. The method as claimed in claim 3, in which, for at least one of the nodes of the path the length of the path is incremented by an offset which is dependent on the order of the cyclic addressing during the formation of the interleaved combination.

5. The method as claimed in claim 2, in which the assignment step is repeated for each of the real-time files in an order of non-decreasing period of the real-time files.

6. The method as claimed in any claim 2, in which the assignment step is repeated for each of the real-time files in an order of non-increasing length of the real-time files.

7. The method as claimed in claim 2, in which the formation of the interleaved combination by cyclic addressing of the lists of given children comprises the following sub-steps:

determining a combined length of the real-time files in the list of the relevant child for each of the given children, and cyclically addressing the lists in an order of non-increasing length of the lists.

8. The method as claimed in claim 2, in which the interleaved combination is formed by transferring, starting with the children having the highest period and finishing at the root, elements from the lists of children of a given parent node to the list of the relevant parent node, comprising, in a cyclic order of the children and for as long as the list of all of these children is not yet empty, the repetition of the following sub-steps:

the transfer of the first element of the list of the relevant child to the list of the parent node or, if the list of the relevant child is empty:

the addition of an empty element to the list of the parent node.

9. A system for interleaving a set of real-time files each comprising a series of uniform blocks and having a period which includes one or more files with a first period and one or more files with a different second period, and the system comprises:

means for forming a first matrix which comprises a number of rows which is equal to a first period;

means for assigning to the first matrix a real-time file having the first period by means of the sub-steps:
determination of an instantaneously least-filled row of the first matrix,
assignment of the series of blocks of the real-time file to the instantaneously least-filled row;

means for forming a second matrix which comprises a number of rows which is equal to a second period;

means of reassigning to the second matrix the blocks already assigned to the first matrix, the blocks of a row of the first matrix being alternately assigned to one of the two rows in the second matrix;

means of concatenating successive columns of the second matrix so as to form the interleaved combination.

10. A system for interleaving a set of real-time files each comprising a series of uniform blocks, and each having a period, in which set mutually different periods of files occurs, the system comprises:

means for forming a tree structure having a root and nodes, in which:
each period of the set corresponds to a number of nodes, the nodes being arranged according to increasing period as from the root,
a number of the nodes are children of a number of parent nodes,
the children of a parent node have a mutually equal period which is a multiple of the period of the parent node, the number of children of the parent node being equal to the quotient of the period of the children and the period of the parent node, assignment means for assigning the series of blocks of a given real-time file consecutively to a list of one of the nodes which has a period equal to that of the given real-time file; and interleaving means for forming the interleaved combination for at least one of the nodes by cyclically addressing the lists thus composed of the children of the latter node, and by addressing consecutively within the lists.

11. A system as claimed in claim 10, in which the assignment means are arranged to:

i) execute the following steps for each candidate node whose period corresponds to the given real-time file:
determining all paths through the tree structure from the root, through the relevant candidate node, and down to the lowest level, calculating for each of the path a length which is equal to a sum over all nodes of the path, the respective products of the number of blocks of the real time files in the list, and the period of the relevant node, and, determining therefrom the instantaneously longest path through the relevant candidate node, and ii) selecting the shortest path from the instantaneously longest paths thus determined and assigning the series of blocks of the given real-time file to the node wherethrough said shortest path extends and whose period corresponds to that of the given real-time file.

12. A system as claimed in claim 11, in which the assignment means are arranged to increment the length of the path for at least one of the nodes of the path by an offset which is dependent on the order of the cyclic addressing during the formation of the interleaved combination.

13. A system as claimed in claim 10, in which the system is arranged for the repeated activation of the assignment means for each of the real-time files and in an order of non-decreasing period of the real-time files.

14. A system as claimed in claim 10, in which the system is arranged for the repeated activation of the assignment means for each of the real-time files and in an order of non-increasing length of the real-time files.

15. A system as claimed in claim 10, in which the interleaving means are arranged to determine, for each of the children of the relevant node, a combined length of the real-time files in the list of the relevant child and for cyclically addressing the lists in an order of non-increasing length of the lists.

16. A system as claimed in claim 10, in which the interleaving means are arranged to form the interleaved combination by transferring, starting with the children having the highest period and finishing at the root, elements from the lists of children of a given parent node to the list of the relevant parent node, comprising, in a cyclic order of the children and for as long as the list of not all of these children is not empty, the repetition of the following sub-steps:

the transfer of the first element of the list of the relevant child to the list of the parent node or, if the list of the relevant child is empty:

the addition of an empty element to the list of the parent node.

17. A method of interleaving a set of real-time files each comprising a series of uniform blocks and having a period, and the set including files with a different period than other files in the set, the method comprising the steps of:

forming a temporary structure in which each of a plurality of different periods of the set of real-time files corresponds to a number of substructures, assigning the series of blocks of a given real-time file consecutively to one of the substructures which corresponds to the period of the given real-time file, and forming an interleaved combination of the files by cyclically addressing the substructures, wherein the set includes one or more files with a first period and one or more files with a different second period, and the method comprises the following steps:

formation of a first matrix which comprises a number of rows which is equal to the first period;

assignment to the first matrix of a real-time file having the first period by means of the sub-steps:

determination of an instantaneously least filled row of the first matrix, assignment of the series of blocks of the real-time file to the instantaneously least-filled row;

formation of a second matrix which comprises a number of rows which is equal to the second period;

assignment to the second matrix of the blocks already assigned to the first matrix by successive assignment of successive columns of the first matrix to columns of the second matrix; and concatenation of successive columns of the second matrix so as to form the interleaved combination.

18. A carrier with an interleaved combination, produced by the method claimed in claim 17.

* * * * *